United States Patent
Robinson et al.

(10) Patent No.: US 6,521,534 B1
(45) Date of Patent: Feb. 18, 2003

(54) TREATMENT OF EXPOSED SILICON AND SILICON DIOXIDE SURFACES

(75) Inventors: Karl M. Robinson; Michael A. Walker, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/639,369

(22) Filed: Aug. 15, 2000

Related U.S. Application Data

(63) Continuation of application No. 08/890,368, filed on Jul. 14, 1997, now Pat. No. 6,103,627, which is a continuation-in-part of application No. 08/604,427, filed on Feb. 21, 1996, now Pat. No. 5,645,737.

(51) Int. Cl.[7] .............................................. H01L 21/302
(52) U.S. Cl. ...................... 438/691; 438/692; 438/693
(58) Field of Search .................. 438/745, 750, 438/751, 691, 692, 693; 134/1.1, 1.2, 1.3

(56) References Cited

U.S. PATENT DOCUMENTS

| | | | |
|---|---|---|---|
| 4,728,623 A | * 3/1988 | Lu et al. .................... 438/239 |
| 5,277,835 A | * 1/1994 | Ohmi et al. ................ 252/79.3 |
| 5,382,296 A | * 1/1995 | Anttila ......................... 134/3 |
| 5,389,194 A | 2/1995 | Rostoker et al. ............ 156/636 |
| 5,478,436 A | 12/1995 | Winebarger et al. ....... 156/636.1 |
| 5,498,293 A | * 3/1996 | Ilardi et al. .................... 134/3 |
| 5,635,053 A | 6/1997 | Aoki et al. .................. 205/746 |
| 5,645,737 A | 7/1997 | Robinson et al. ............. 216/99 |
| 5,704,987 A | * 1/1998 | Huynh et al. ................... 134/6 |
| 5,712,759 A | * 1/1998 | Saenger et al. ............. 361/321 |
| 5,783,495 A | 7/1998 | Li et al. ...................... 438/738 |
| 5,806,126 A | 9/1998 | De Larios et al. ............. 15/102 |
| 5,827,781 A | 10/1998 | Skrovan et al. ............. 438/692 |
| 5,853,522 A | 12/1998 | Krussell et al. .............. 156/345 |
| 5,942,131 A | 8/1999 | Robinson et al. ............. 216/99 |
| 5,987,454 A | 11/1999 | Small .......................... 510/175 |
| 6,096,650 A | 8/2000 | Robinson et al. ........... 438/689 |
| 6,103,627 A | 8/2000 | Robinson et al. ........... 438/692 |

* cited by examiner

Primary Examiner—Benjamin L. Utech
Assistant Examiner—Lan Vinh
(74) Attorney, Agent, or Firm—Workman, Nydegger & Seeley

(57) ABSTRACT

A chemical mechanical polishing step is performed to expose a silicon/silicon dioxide interface on a surface situated on a semiconductor substrate. The semiconductor substrate is dipped in a solution of about 200 parts of deionized water, about 1 part of hydrofluoric acid, and at least 5 parts tetramethyl ammonium hydroxide. The exposed silicon/silicon dioxide interface is then contacted with an organic carboxylic acid surfactant having a critical micelle concentration greater than or equal to $1^{-7}$ m/l and having a pH from about 2.2 to about 7. Lastly, the exposed silicon/silicon dioxide interface is rinsed in deionized water or sulfuric acid to remove silicon dioxide particles from the exposed silicon/silicon dioxide interface, leaving a very clean, low particulate surface on both the silicon dioxide and silicon portions thereof, with little or no etching of the silicon portion.

26 Claims, 2 Drawing Sheets

TREATMENT OF EXPOSED SILICON AND SILICON DIOXIDE SURFACES

This is a continuation of U.S. patent application Ser. No. 08/890,368, filed on Jul. 14, 1997, titled "TREATMENT OF A SURFACE HAVING AN EXPOSED SILICON/SILICA INTERFACE", now U.S. Pat. No. 6,103,627, which is a continuation-inpart of U.S. patent application Ser. No. 08/604,427, filed on Feb. 21, 1996, titled "WET CLEAN OF A SURFACE HAVING AN EXPOSED SILICON/ SILICA INTERFACE", now U.S. Pat. No. 5,645,737, both of which are incorporated herein by reference.

BACKGROUND OF THE INVENTION

1. The Field of the Invention

The present invention relates to the manufacture of semiconductor devices. More particularly, the present invention is directed to methods for treating a surface having an exposed silicon/silicon dioxide interface, which treatment is useful in the manufacture of semiconductor devices. The methods are particularly useful for a post chemical mechanical polishing clean of a surface having an exposed silicon/silicon dioxide interface.

2. The Relevant Technology

Chemical mechanical polishing is finding increasing application in the manufacture of semiconductor devices to planarize surfaces in preparation for high resolution photolithography and for other purposes. Chemical mechanical polishing involves polishing an uppermost film on the surface of a semiconductor substrate by use of a polishing pad and a polishing slurry. The slurry contains polishing particles. Pad types and slurry compositions vary depending on the material being polished and other factors.

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Chemical mechanical polishing is particularly useful where feature sizes of less than 0.5 micron must be defined over a topography already existing on the substrate surface. In such circumstances, a reflowed silicon dioxide glass layer is insufficiently planar, but with chemical mechanical polishing, sufficient planarity may be achieved to facilitate high resolution photolithography. Chemical mechanical polishing may also be employed to completely remove portions of a layer being polished, so that underlying material is exposed. In either case, a clean step is required after the chemical mechanical polishing to clean polishing slurry from the substrate surface.

Where silicon dioxide or silicon is the layer being polished, the polishing slurry typically contains silicon dioxide particles having an average size of about 30 nanometers (nm). The silicon dioxide particles that remain on a silicon dioxide surface after polishing are typically removed by a clean process including an HF (hydrofluoric acid solution) dip followed by a deionized water rinse. Silicon dioxide particles and other contamination remaining on a silicon surface after polishing are typically cleaned in an ammonium hydroxide solution or the like.

Where a silicon dioxide layer is polished until some silicon is exposed, or where a silicon layer is polished until some silicon dioxide is exposed, the above typical clean processes can result in problems. While the typical clean process for silicon dioxide is effective to remove silicon dioxide particles from a silicon dioxide surface, a silicon surface is not adequately cleaned. Silicon dioxide particles tend to collect on the silicon surface and, once the clean process is complete, tend to permanently adhere there, regardless of further cleans. The typical clean processes for silicon are likewise ineffective to remove silicon dioxide particles from a silicon dioxide surface. Further, an ammonium hydroxide clean, which etches silicon, can be unacceptable where particularly fine or small silicon structures must be preserved. Accordingly, there exists a need for a clean process which can remove silicon dioxide particles from both silicon dioxide and silicon surfaces, and particularly without etching silicon surface.

SUMMARY OF THE INVENTION

In accordance with the present invention, a method is presented for treating an exposed silicon/silicon dioxide interface on a surface situated on a semiconductor substrate. The interface is exposed by a chemical mechanical polishing step. The interface is next contacted with a solution composed, by volume, of 200 parts of deionized water, 1 part of hydrofluoric acid, and at least 5 parts of tetramethyl ammonium hydroxide.

The interface is again contacted with an organic carboxylic acid surfactant having a critical micelle concentration greater than or equal to $10^{-7}$ m/l. The organic carboxylic acid surfactant, which can having a pH greater than or equal to 4, can effectively clean the interface. The critical micelle concentration greater than or equal to $10^{-7}$ m/l of the organic carboxylic acid surfactant significantly prevents the formation of a charge differential between the silicon dioxide and silicon portions of the surface, which charge differential would otherwise cause any silicon dioxide particles present to remain on the silicon portions of the surface. The surfactant properties of the selected organic carboxylic acid helps to remove any silicon dioxide particles from the surface. The organic carboxylic acid surfactant can be pentadecanoic acid or other similar long chain acids. A preferred organic carboxylic acid surfactant is citric acid.

Lastly, silicon dioxide particles are removed from the interface by optionally contacting the same with deionized water or sulfuric acid. The deionized water or sulfuric acid removes the organic carboxylic acid surfactant from the surface, leaving a clean surface with fewer particulate matter on both the silicon dioxide and silicon portions thereof, with substantially no etching of the silicon portion.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As an overview, the present invention provides a method for cleaning surfaces having silicon and silicon dioxide exposed, and particularly for removing from such surfaces silicon dioxide particles left after chemical mechanical polishing. The exposed silicon may be of any type, including for example doped and undoped single crystal silicon, epitaxial silicon, polysilicon, and amorphous silicon. The silicon dioxide may also be of any type such as doped or undoped, grown or deposited, including any type of silicon dioxide glass. The inventive method described in detail below successfully removes silicon dioxide particle contamination from both silicon dioxide and silicon surfaces without substantially etching the silicon surface.

Figure 1:
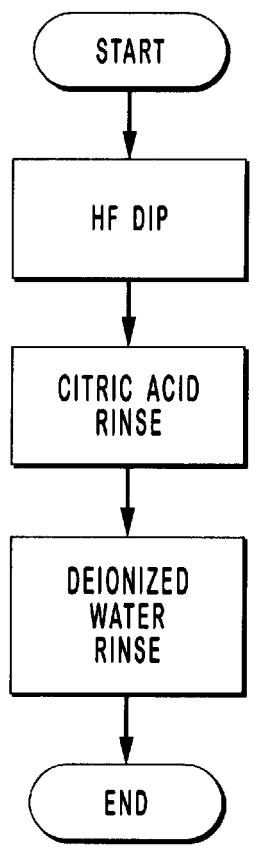
FIG. 1 is a flow diagram of a method of the present invention.

According to the present invention, a surface having an exposed silicon/silicon dioxide interface is cleaned by performing the process illustrated in the flow diagram of FIG. 1. The surface is typically a surface of a semiconductor substrate which has been chemically mechanically polished, leaving silicon dioxide particle contamination.

As a first step, the surface with the exposed silicon/silicon dioxide interface is etched by contacting the same with a hydrogen halide acid solution, such as HF. The contacting is preferably achieved by dipping the substrate in the hydrogen halide acid solution. The first step of the process flow shown in FIG. 1, the HF dip, is preferably performed in hydrofluoric acid having preferably a concentration within the range of about 4:1 to about 250:1, and most preferably a concentration of about 100:1.

Other known ways of contacting the surface with HF may optionally be substituted for the HF dip. Most preferably, the hydrogen halide acid solution is composed of about 200 parts by volume of ionized water, about 1 part of hydrofluoric acid by volume, and at least 5 parts of tetramethyl ammonium hydroxide by volume. While an HF solution can be used as stated above, the preferred hydrogen halide acid solution is cleaner than an HF solution and also slows down the etch to bring about an easier to control lower material removal rate. Also, the preferred solution changes the selectivity to oxides. Particularly, the proposed etchant solution lowers the material removal rate of one type of oxide being etched without necessarily effecting another type of oxide that is also exposed to the etchant solution. By way of example, the proposed solution will have a lower material removal rate for doped oxide than it will for undoped oxide.

Next, the surface having the exposed silicon/silicon dioxide interface of said surface is contacted with an organic carboxylic acid surfactant having a critical micelle concentration greater than or equal to $10^{-7}$ m/l. Preferably, the organic carboxylic acid surfactant will be citric acid. The organic carboxylic acid surfactant can be pentadecanoic acid or other similar long chain acids. The contact with the surface is preferably achieved by dipping the substrate in citric acid or flowing citric acid, rinsing the substrate in citric acid, spraying the surface of the substrate with citric acid, or a similar technique. Last, the surface is rinsed with deionized water. This may be achieved in any of many ways known to those of skill in the art.

The second step of the process flow shown in FIG. 1, the organic carboxylic acid surfactant rinse, such as with a citric acid rinse, should be performed soon, and preferably immediately, after the HF dip, and without any intervening rinse in deionized water. If a deionized water rinse were to follow the HF dip, silicon dioxide particles would collect on the silicon portion of the surface. This is a result of a buildup of charge on the silicon dioxide particles and the silicon dioxide portions of the surface. At a pH value of 7 for deionized water, the silicon dioxide particles and the silicon dioxide portion of the surface become negatively charged, repelling each other, while the silicon portions of the surface remain neutral or are only slightly negatively charged. The mutual repulsion of the silicon dioxide particles and the silicon dioxide portions of the surface tends to concentrate the silicon dioxide particles on the silicon portions of the surface, and to prevent the silicon dioxide particles from being removed by translational motion along the surface.

The second step of the process flow shown in FIG. 1, the organic carboxylic acid surfactant rinse, shown in FIG. 1 as a citric acid rinse, is performed in organic carboxylic acid surfactant of sufficient strength so as to have a critical micelle concentration greater than or equal to $10^{-7}$ m/l. At such critical micelle concentrations, no significant charge is built up on the silicon dioxide particles and silicon dioxide portions of the surface. The immediate transfer of the surface from contact with HF to contact with the organic carboxylic acid surfactant, without an intervening deionized water rinse, prevents the silicon dioxide particles from changing to a more negative charge. The surfactant properties of the organic carboxylic acid surfactant assist in washing away the particles, while preventing the mutual repulsion of the silicon dioxide particles and the silicon dioxide portions of the surface, allowing the silicon portions of the surface to be cleaned of silicon dioxide particles.

The inventive method focuses upon the critical micelle concentration (CMC) rather than the pH of the organic carboxylic acid surfactant. The CMC is a factor of how soluble the organic carboxylic acid surfactant, such as citric acid, is in the solution. The CMC solubility parameter measures the saturation point of the organic carboxylic acid surfactant in the solution before the formation of micelles. As a surfactant chemical, the ionic carboxylic has a cleaning effect by reducing of the surface tension by the addition of the molecules at the particle surface. As long as the CMC is exceeded, the surface tension is reduced or modified as efficiently as possible for a given molecule.

CMC, in some cases, is equivalent to pH, and in some cases it is not, depending upon the ionic valency of the molecules. In the case of citric acid, which ionizes into $COO^-$ and $H^+$, there are three (3) hydrogen ion groups and three (3) carboxylic ion groups. The hydrogen ion concentration yields a certain pH, or acidic rating, whereas the molecule yields the CMC. The CMC determines the minimum concentration necessary for cleaning consistency, not just the pH which also contributes to the cleaning consistency. Thus, CMC is a more preferred criteria to quantify a cleaning application than pH.

By way of example, the pH increases for two COOH groups in solution as compared to only one COOH group. Cleaning consistency, however, stays the same since CMC is a constant. CMC is a constant for a given molecule in a given solution because only a certain number of molecules can be present and acting upon the interface on the surface at any one time. The cleaning at the interface that takes place is the reduction of the surface tension of the water at the interface between the particles and the solution which is caused by the molecules present at the interface.

For one carboxylic acid group, a CMC of $10^{-7}$ m/l is the same as pH 7, which is the pH of deionized water. A organic carboxylic acid surfactant having a CMC of $10^{-7}$ m/l and a pH higher than the isoelectric point of the particle is effective to clean the exposed silicon/silicon dioxide interface. The pH, however, must be less than 7 to effectively clean the interface. Also, the silicon/silicon dioxide interface is governed by the isoelectric point of the silicon verses the silicon dioxide, which is at 2.2 pH. As such, the organic carboxylic acid surfactant will preferably have a CMC of $10^{-7}$ m/l and a pH greater than or equal to 2.2 and less than 7.

In the third step of the process flow shown in FIG. 1, a deionized water rinse is illustrated as an example of a rinse. Alternatively, the process could do without the DI rinse altogether, or could use a piranha clean ($H_2SO_4$). In such a rinse, the organic carboxylic acid surfactant is gradually removed from the surface, eventually passing a point at which the silicon dioxide particles and the silicon dioxide portions of the surface become charged. By that point, however, the silicon dioxide particles have been substantially removed from the surface, either by the citric acid rinse or by the initial stages of the deionized water rinse.

Figure 2:
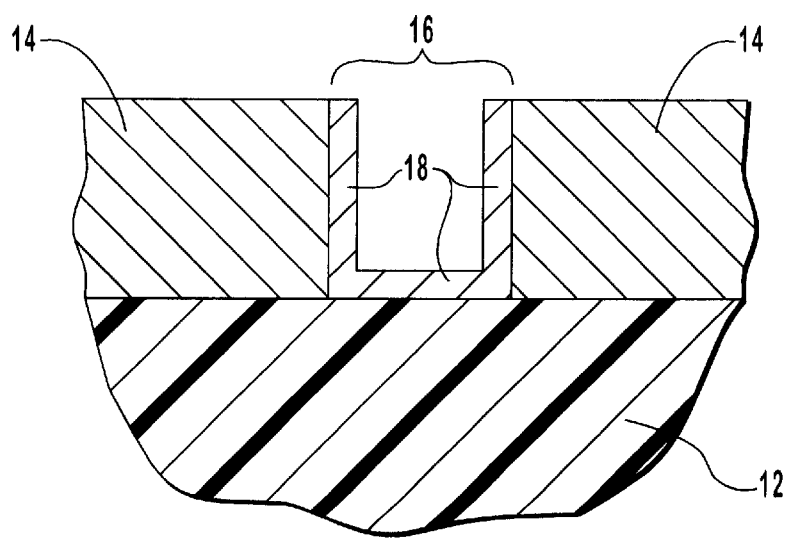
FIG. 2 is a partial cross section of a partially formed semiconductor device on which a method of the present invention may be beneficially performed.
Figure 3:
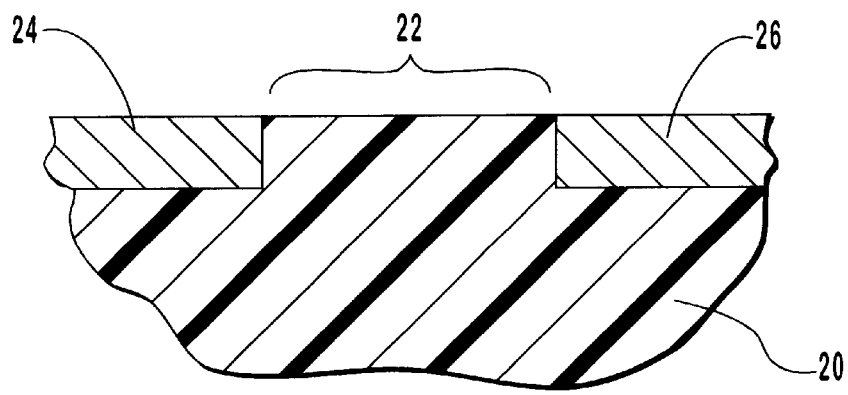
FIG. 3 is another partial cross section of a partially formed semiconductor device on which a method of the present invention may be beneficially performed.
Figure 4:
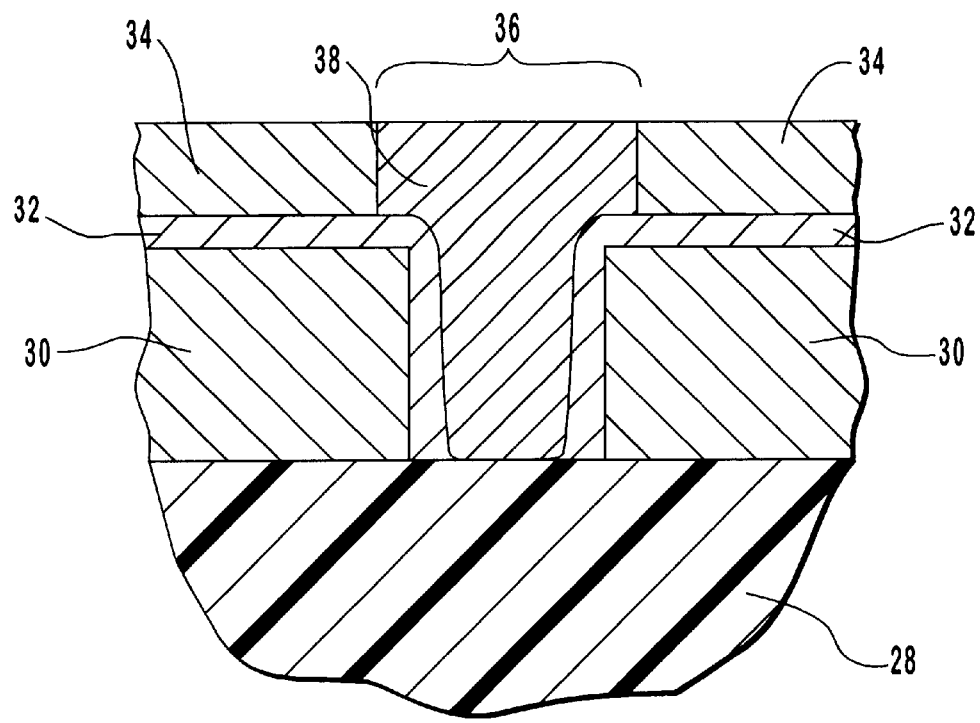
FIG. 4 is yet another partial cross section of a partially formed semiconductor device on which a method of the present invention may be beneficially performed.

Presently preferred applications for the method steps seen in FIG. 1 are illustrated in FIGS. 2–4.

FIG. 2 is a partial cross section of a partially formed semiconductor device showing a substrate 12 upon which a layer of silicon dioxide 14 such as BPSG has been formed. Layer of silicon dioxide 14 has been etched away at a certain location, leaving a space 16 therein. A thin layer of silicon has been deposited conformably over substrate 12 and layer of silicon dioxide 14, then removed by chemical mechanical polishing until only a layer of silicon 18 at space 16 remains. Layer of silicon 18 will function in the completed semiconductor device as the lower capacitor plate of a container capacitor.

The method steps of the present invention are particularly useful to clean a substrate having the structure shown in FIG. 2. The chemical mechanical polishing used to form the structure shown in FIG. 2 leaves silicon dioxide particles that must be removed. Because both layer of silicon dioxide 14 and layer of silicon 18 are exposed, a standard HF dip followed by a deionized water rinse causes silicon dioxide particles to collect on silicon layer 18, particularly on the uppermost upward facing surfaces thereof, near the interface of layer of silicon dioxide 14 and layer of silicon 18. Because capacitance of a capacitor depends on surface area and hence on such fine features as surface roughness, any clean that etches silicon would negatively impact capacitance of a capacitor formed with layer of silicon 14. The method steps of the present invention avoid both problems by providing a cleaning method that removes silicon dioxide particles from both silicon dioxide and silicon without etching silicon.

The method steps of the present invention also finds useful application where planarization of active and isolation regions is desired. FIG. 3 shows a silicon substrate 20 having an active region 22 isolated by field oxide regions 24 and 26. The structure shown in FIG. 3 may be formed by etching a silicon substrate to form an island at the location desired for the active region, then masking the island and growing oxide around the island. Alternatively, the island may be left unmasked and oxide may be grown around and over the island. In either case, the grown oxide is then polished by chemical mechanical polishing back to the level of the unoxidized silicon of the island, resulting in the structure of FIG. 3. The method of the present invention may then be applied to clean the surfaces of active region 22 and field oxide regions 24 and 26.

Further beneficial use of the present invention may be found where silicon plugs are isolated and planarized by means of chemical mechanical polishing. FIG. 4 shows a substrate 28 having raised structures 30 such as gate stacks formed thereon. Raised structures 30 are enclosed in a layer of spacer material 32 over which a layer of silicon dioxide 34 such as BPSG has been conformably deposited. A space 36 has then been etched in layer of silicon dioxide 34 down to substrate 28 with an etch process selective to spacer material 32. A layer of silicon such as doped polysilicon has then been deposited conformably over substrate 28, spacer material 32, and layer of silicon dioxide 34. The layer of silicon is then polished by chemical mechanical polishing back to the level of layer of silicon dioxide 34, resulting in a silicon plug 38. The method of the present may then be applied to clean the exposed surfaces of layer of silicon dioxide 34 and silicon plug 38.

The method of the present invention may further be beneficially applied in virtually any process requiring a clean of a surface having an exposed silicon/silicon dioxide interface, particularly where silicon dioxide particles or any other particles with similar electrical characteristics are present.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for treating a surface having an exposed silicon/silicon dioxide interface after a chemical mechanical polishing process that generates particles, including silicon dioxide particles, deposited over the silicon/silicon dioxide interface, said method comprising:

providing a carboxylic acid with a critical micelle concentration; and contacting, under acidic conditions, the exposed interface with the carboxylic acid having a critical micelle concentration greater than or equal to $10^{-7}$ m/l, so that there is no substantial etching of the exposed silicon surface upon said contacting the exposed interface with the carboxylic acid.

2. The method as defined in claim 1, further comprising, prior to contacting the exposed interface with said carboxylic acid surfactant, contacting the exposed interface with a hydrogen halide acid solution.

3. The method as defined in claim 1, further comprising, after contacting the exposed interface with said carboxylic acid surfactant, contacting the exposed interface with sulfuric acid.

4. The method as defined in claim 1, further comprising, after contacting the exposed interface with said carboxylic acid surfactant, contacting the exposed interface with deionized water.

5. The method as defined in claim 1, wherein the exposed interface is between a silicon dioxide surface and at least one of:
    an exposed edge of a capacitor plate;
    an exposed field oxide surface; and
    an exposed surface of a contact plug.

6. The method as defined in claim 1, wherein:
    the exposed interface includes interface surfaces comprising, respectively, silicon and silicon dioxide;
    each said interface surface has thereon both particles of silicon dioxide and other particles not comprising silicon dioxide but having similar electrical characteristics; and
    the method further comprises contacting the exposed interface with a fluid to remove:
        said particles of silicon dioxide from each said interface surface; and
        said other particles not comprising silicon dioxide but having similar electrical characteristics from each said interface surface.

7. A cleaning method, comprising:
    exposing a silicon/silicon dioxide interface on a surface; and
    contacting, under acidic conditions, the exposed interface with a carboxylic acid having a critical micelle concentration greater than or equal to $10^{-7}$ m/l, so that there is no substantial etching of the silicon exposed in the silicon/silicon dioxide interface.

8. The method as defined in claim 7, further comprising, prior to contacting the exposed interface with said carboxylic acid surfactant and after said exposing said silicon/silicon dioxide interface, contacting said exposed surfaces of silicon and silicon dioxide with a hydrogen halide acid solution.

9. The method as defined in claim 7, further comprising, after contacting the exposed interface with said carboxylic acid surfactant, contacting the exposed interface with sulfuric acid.

10. The method as defined in claim 7, further comprising, after contacting the exposed interface with said carboxylic acid surfactant, contacting the exposed interface with deionized water.

11. The method as defined in claim 7, wherein the exposed interface is between a silicon dioxide surface and at least one of:
    an exposed edge of a capacitor plate;
    an exposed field oxide surface; and
    an exposed surface of a contact plug.

12. The method as defined in claim 7, wherein:
    the exposed interface includes interface surfaces comprising, respectively, silicon and silicon dioxide;
    each said interface surface has thereon both particles of silicon dioxide and other particles not comprising silicon dioxide but having similar electrical characteristics; and
    the method further comprises contacting the exposed interface with a fluid to remove:
        said particles of silicon dioxide from each said interface surface; and
        said other particles not comprising silicon dioxide but having similar electrical characteristics from each said interface surface.

13. A method for determining the minimum concentration necessary for cleaning consistency of a surface, the method comprising:
    performing a chemical mechanical polishing process upon the surface to expose a silicon/silicon dioxide interface; and
    contacting, under acidic conditions, the exposed silicon/silicon dioxide interface with a carboxylic acid having a critical micelle-concentration greater than or equal to $10^{-7}$ m/l, so that there is no substantial etching of the silicon exposed in the silicon/silicon dioxide interface.

14. The method as defined in claim 13, further comprising, prior to contacting the exposed silicon/silicon dioxide interface with said carboxylic acid surfactant and after said chemical mechanical polishing process, contacting the exposed silicon/silicon dioxide interface with a hydrogen halide acid solution.

15. The method as defined in claim 13, further comprising, after contacting the exposed silicon/silicon dioxide interface with said carboxylic acid surfactant, contacting the exposed interface with sulfuric acid.

16. The method as defined in claim 13, further comprising, after contacting the exposed silicon/silicon dioxide interface with said carboxylic acid surfactant, contacting the exposed silicon/silicon dioxide interface with deionized water.

17. The method as defined in claim 13, wherein the exposed silicon/silicon dioxide interface is between a silicon dioxide surface and at least one of:
    an exposed edge of a capacitor plate;
    an exposed field oxide surface; and
    an exposed surface of a contact plug.

18. The method as defined in claim 13, wherein:
    the exposed silicon/silicon dioxide interface includes interface surfaces comprising, respectively, silicon and silicon dioxide;
    each said interface surface has thereon both particles of silicon dioxide and other particles not comprising silicon dioxide but having similar electrical characteristics; and
    the method further comprises contacting the exposed silicon/silicon dioxide interface with a fluid to remove:
        said particles of silicon dioxide from each said interface surface; and
        said other particles not comprising silicon dioxide but having similar electrical characteristics from each said interface surface.

19. A method for removing particles from a surface comprising silicon and from a surface comprising silicon dioxide, the method comprising:
    providing a carboxylic acid with a critical micelle concentration, and
    contacting, under acidic conditions, the surfaces comprising, respectively, silicon and silicon dioxide with the carboxylic acid having a critical micelle concentration greater than or equal to $10^{-7}$ m/l, so that there is no substantial etching of the surface comprising silicon.

20. The method as defined in claim 19, further comprising, prior to contacting the surface comprising silicon and the surface comprising silicon dioxide with said carboxylic acid surfactant, contacting the surfaces comprising, respectively, silicon and silicon dioxide with a hydrogen halide acid solution.

21. The method as defined in claim 19, wherein said contacting prevents the formation of a charge differential between the surface comprising silicon and the surface comprising silicon dioxide.

22. The method as defined in claim 19, wherein:
    the surfaces comprising, respectively, silicon and silicon dioxide have thereon both particles of silicon dioxide and other particles not comprising silicon dioxide;

said other particles have similar electrical characteristics; and the method further comprises contacting the surfaces comprising, respectively, silicon and silicon dioxide with a fluid to remove said particles of silicon dioxide and said other particles not comprising silicon dioxide.

23. The method as defined in claim 19, further comprising, after contacting the surface comprising silicon and the surface comprising silicon dioxide with said carboxylic acid, contacting said surface comprising, respectively, silicon and silicon dioxide with sulfuric acid.

24. The method as defined in claim 19, further comprising, after contacting the surface comprising silicon and the surface comprising silicon dioxide with said carboxylic acid, contacting said the surface comprising, respectively, of silicon and of silicon dioxide with deionized water.

25. The method as defined in claim 19, wherein the surfaces comprising, respectively, silicon and silicon dioxide form an interface between a silicon dioxide surface and at least one of:

an exposed edge of a capacitor plate;

an exposed field oxide surface; and an exposed surface of a contact plug.

26. A particle removal method, comprising:

performing a chemical mechanical planarization process to:

expose a first surface comprising silicon dioxide and a second surface that is at least one of:

an exposed edge of a capacitor plate;

an exposed field oxide surface; and an exposed surface of a contact plug;

form on each of the first and second surfaces particles of silicon dioxide and also other particles not comprising silicon dioxide but having similar electrical characteristics; and prevent the formation of a charge differential between the first and second surfaces;

contacting said first and second surfaces with a hydrogen halide acid solution;

contacting, under acidic conditions, said first and second surfaces with a carboxylic acid having a critical micelle concentration greater than or equal to $10^{-7}$ m/l, so that there is no substantial etching of the second surface; and contacting said first and second surfaces with at least one of deionized water and sulfuric acid to remove from the first and second surfaces both the particles of silicon dioxide and the other particles not comprising silicon dioxide.

* * * * *

UNITED STATES PATENT AND TRADEMARK OFFICE
CERTIFICATE OF CORRECTION

PATENT NO.    : 6,521,534 B1
DATED         : February 18, 2003
INVENTOR(S)   : Karl M. Robinson and Michael A. Walker It is certified that error appears in the above-identified patent and that said Letters Patent is hereby corrected as shown below:

Column 1,
Line 8, change "continuation-inpart" to -- continuation-in-part --

Column 2,
Line 16, after "etching" insert -- the --

Column 8,
Line 3, change "micelle-concentration" to -- micelle concentration --

Signed and Sealed this

Twenty-second Day of April, 2003

JAMES E. ROGAN
*Director of the United States Patent and Trademark Office*